United States Patent
Hsieh et al.

(10) Patent No.: US 7,745,832 B2
(45) Date of Patent: Jun. 29, 2010

(54) SEMICONDUCTOR LIGHT-EMITTING ELEMENT ASSEMBLY WITH A COMPOSITE SUBSTRATE

(75) Inventors: Min-Hsun Hsieh, Hsinchu (TW);
Chou-Chih Yin, Hsinchu (TW);
Chien-Yuan Wang, Hsinchu (TW);
Jen-Shui Wang, Hsinchu (TW);
Chia-Fen Tsai, Hsinchu (TW);
Chia-Liang Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 241 days.

(21) Appl. No.: 11/222,803

(22) Filed: Sep. 12, 2005

(65) Prior Publication Data
US 2006/0076571 A1    Apr. 13, 2006

(30) Foreign Application Priority Data

Sep. 24, 2004  (TW) ............... 93129157 A
Feb. 4, 2005   (TW) ............... 94103538 A
May 6, 2005    (TW) ............... 94114630 A
Jun. 29, 2005  (TW) ............... 94121784 A
Aug. 22, 2005  (TW) ............... 94128644 A

(51) Int. Cl.
*H01L 33/00* (2010.01)
*H01L 23/34* (2010.01)

(52) U.S. Cl. ............... 257/79; 257/706; 257/E23.101; 257/E33.001

(58) Field of Classification Search ............ 257/79, 257/88, 99, 100, 678, 680, 701, 706, E23.101, 257/E23.11, E23.111, E23.112, E23.113, 257/E33.001–E33.077
See application file for complete search history.

(56) References Cited

U.S. PATENT DOCUMENTS

| | | | |
|---|---|---|---|
| 4,979,019 A * | 12/1990 | Paquette et al. | 257/747 |
| 6,501,103 B1 | 12/2002 | Jory et al. | |
| 6,520,628 B2 * | 2/2003 | McClelland et al. | 347/65 |
| 2002/0106528 A1 * | 8/2002 | Jin et al. | 428/610 |
| 2002/0179920 A1 * | 12/2002 | Kuramachi | 257/99 |
| 2006/0012299 A1 * | 1/2006 | Suehiro et al. | 313/512 |

* cited by examiner

*Primary Examiner*—Sue Purvis
*Assistant Examiner*—Kevin Quinto
(74) *Attorney, Agent, or Firm*—Rabin & Berdo, PC

(57) ABSTRACT

A semiconductor light-emitting element assembly, comprising a composite substrate, a circuit layout carrier, a connecting structure, a recess, and a semiconductor light-emitting element, is disclosed. The connecting structure is used for bonding the composite substrate with the circuit layout carrier. The recess is formed by the circuit layout carrier and extends toward the composite substrate. The semiconductor light-emitting element is deposited in the recess and electrically connected to the circuit layout carrier.

32 Claims, 7 Drawing Sheets

SEMICONDUCTOR LIGHT-EMITTING ELEMENT ASSEMBLY WITH A COMPOSITE SUBSTRATE

RELATED APPLICATIONS

The present application claims the right of priority based on Taiwan Application Serial Number 093129157, filed Sep. 24, 2004; Taiwan Application Serial Number 094114630, filed May 6, 2005; Taiwan Application Serial Number 094103538, filed Feb. 4, 2005; Taiwan Application Serial Number 094121784, filed Jun. 29, 2005; and Taiwan Application Serial Number 094128644, filed Aug. 22, 2005, the disclosure of which is incorporated herein by reference in its entirety.

FIELD OF THE INVENTION

The present invention relates to the packaging of a semiconductor light-emitting element, and more particularly to a light-emitting element assembly comprising a composite substrate and flexible adhesive material.

BACKGROUND OF THE INVENTION

U.S. Pat. No. 6,501,103 discloses a light emitting diode (LED) assembly comprising an LED (1), a circuit board (2), and a heat-dissipating substrate (3), wherein the LED (1) has a die (12) bound on a heat-dissipating plate (10), and pads electrically connected to a printed circuit board (13). The LED (1) is fixed on the circuit board (2) and the heat-dissipating substrate (3).

The above-mentioned technology generally uses a mechanical method or a soldering method to connect the printed circuit board (13) with the heat-dissipating plate (10). The mechanical method, such as screwing and buckling, needs a large space to install related mechanical devices, and thus is disadvantageous for miniature electronic elements. The soldering method needs to melt solder at a relative high temperature for connecting two different types of materials, wherein the solder temperature is generally higher than 450° C. Usually, the material forming the heat-dissipating plate (10) is metal, such as copper, etc., wherein the thermal expansion coefficient of copper is about $12 \times 10^{-6}/°$ C. However, the thermal expansion coefficient of the material forming the LED (12) is generally smaller than $10 \times 10^{-6}/°$ C. or between $4 \times 10^{-6}/°$ C. and $8 \times 10^{-6}/°$ C. The difference between the thermal expansion coefficients is likely to cause deformation and fatigue between the LED (12) and the heat-dissipating plate (10) under high temperature, thus reducing the reliability of products containing LED (12) and the heat-dissipating plate (10). In order to reduce the thermal expansion coefficient difference between two materials, the conventional technology adopts a ceramic material of a low thermal expansion coefficient, such as aluminum nitride (AlN), for forming the heat-dissipating plate (10). However, the ceramic material such as AlN is too expensive to be acceptable to market.

In view of the conventional technology's disadvantages, the present invention as described below is provided for achieving effective heat dissipation from the LED, while reducing the negative influence resulted from the difference of the thermal expansion coefficients between different materials.

SUMMARY OF THE INVENTION

For overcoming the conventional problems as described in the aforementioned background, the object of the present invention is to provide a semiconductor light-emitting element assembly for achieving good heat dissipation of an LED and lessening the adverse influence resulted from the difference between the thermal expansion coefficients of different types of materials in the LED assembly.

To achieve this and other objects, the semiconductor light-emitting element assembly of the present invention comprises a composite substrate with a thermal expansion coefficient substantially smaller than or equal to $12 \times 10^{-6}/°$ C., and a thermal conductivity coefficient substantially greater than or equal to 150 W/mK; a circuit layout carrier; a connecting structure for bonding the composite substrate with the circuit layout carrier; a recess formed on the circuit layout carrier and extending toward the composite substrate; and a semiconductor light-emitting element disposed on one side of the composite substrate and in the recess, and is electrically connected to the circuit layout carrier.

Further, the semiconductor light-emitting element assembly is in a flip-chip structure, and an electrical contact formed on at least one portion of the surface of the recess is electrically connected to the semiconductor light-emitting element and the circuit layout carrier.

The material forming the composite substrate is a metal matrix composite (MMC), a polymer matrix composite (PMC), a ceramic matrix composite (CMC), or an equivalent or combination thereof.

Meanwhile, the difference between the thermal expansion coefficient of the semiconductor light-emitting element and the thermal expansion coefficient of the composite substrate is substantially smaller than or equal to $10 \times 10^{-6}/°$ C.

The circuit layout carrier is a semiconductor substrate, a printed circuit board (PCB), a flexible printed circuit (FPC), a Si substrate, a ceramic substrate or an equivalent or combination thereof.

In the semiconductor light-emitting element assembly of the present invention, the connecting structure comprises a flexible adhesive layer. Preferably, the material forming the flexible adhesive layer includes benzocyclobutene (BCB), epoxy, polyimide, SOG (Spin On Glass), silicone, a solder, an equivalent or combination thereof.

In the semiconductor light-emitting assembly of the present invention, the connecting structure comprises a plurality of metal layers eutecticly bonding the semiconductor light-emitting element to the semiconductor substrate.

In the semiconductor light-emitting element assembly of the present invention, the connecting structure further comprises a reaction layer formed on one side of the flexible adhesive layer for enhancing the bonding strength between the composite substrate and the circuit layout carrier, and the material forming the reaction layer is silicon nitride ($SiN_x$), epoxy, titanium (Ti), chromium (Cr), or an equivalent or combination thereof.

In the semiconductor light-emitting element assembly of the present invention, the recess is formed in a tapered shape, or in a so-called funnel shape. Meanwhile, the recess further contains a reflection layer for promoting light extraction efficiency.

The semiconductor light-emitting element assembly of the present invention further comprises a light-pervious member, such as an optical lens, covering the recess.

The semiconductor light-emitting element assembly further comprises wavelength-converting material disposed above the semiconductor light-emitting element for converting the wavelength of light from the semiconductor light-emitting element, and the wavelength-converting material is a fluorescent powder, a color filter, or an equivalent or combination thereof.

The semiconductor light-emitting assembly further comprises a planarizing layer formed between the composite substrate and the connecting structure. The planarizing layer includes nickel (Ni) or other materials adherable to the connecting structure.

The aforementioned semiconductor light-emitting element is a light-emitting diode (LED), a laser diode (LD), or an equivalent or combination thereof.

The semiconductor light-emitting element assembly of the present invention further comprises a convective heat transfer device assembled with the composite substrate for promoting the heat dissipation performance thereof.

BRIEF DESCRIPTION OF THE DRAWINGS

The foregoing aspects and some attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Hereinafter, the features of the present invention are explained by referring to the related figures illustrating preferred embodiments thereof.

First Embodiment

Figure 1A:
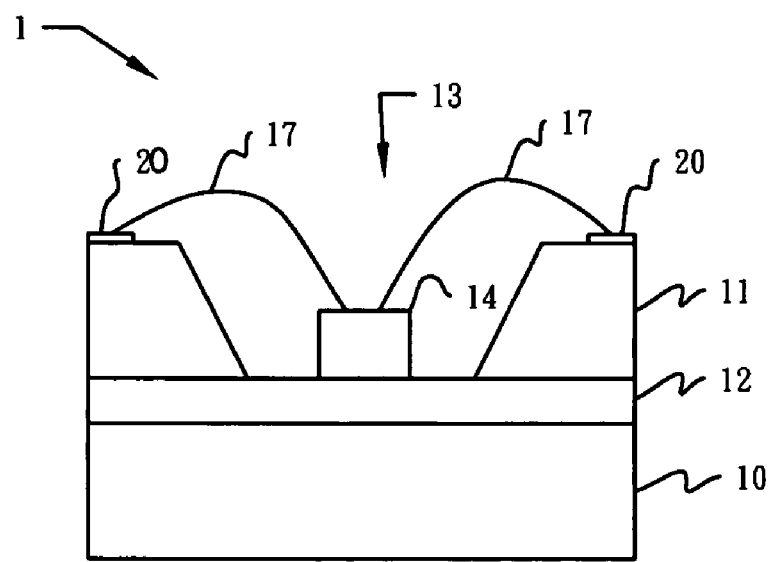
FIGS. 1A and 1B are schematic diagrams showing the structure of a semiconductor light-emitting element assembly in accordance with a first embodiment of the present invention.
Figure 1B:
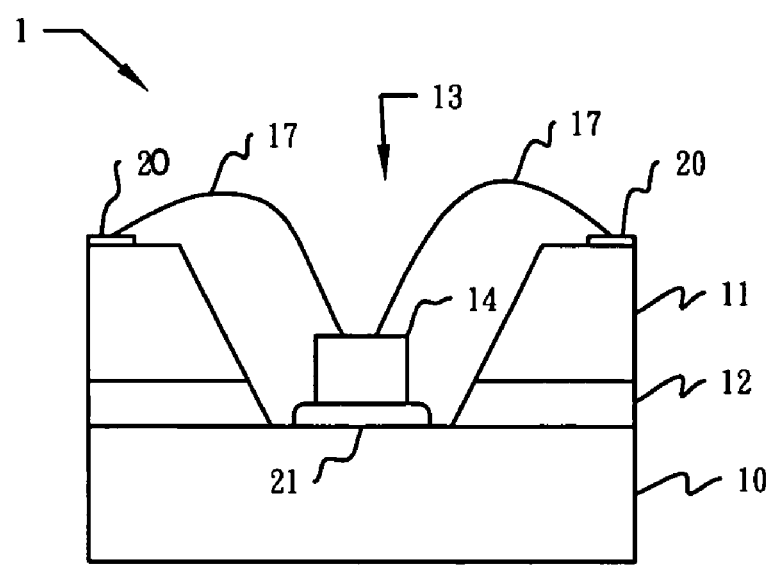

FIGS. 1A and 1B are schematic diagrams showing the structure of a semiconductor light-emitting element assembly 1 in accordance with a first embodiment of the present invention. The indications of the respective reference numbers therein are described as follows: 1 indicates a semiconductor light-emitting element assembly; 10 indicates a composite substrate; 11 indicates a circuit layout carrier; 12 indicates a connecting structure; 13 indicates a recess; 14 indicates a semiconductor light-emitting element. Further, the same reference numbers are used for the similar elements in other figures, and will not be explained again hereinafter.

A recess 13 is formed within or from a circuit layout carrier 11, and the circuit layout carrier 11 is bonded with a composite substrate 10 by a connecting structure 12. A semiconductor light-emitting element 14 is fixed within the recess 13, and conductive wires 17 are used to connect the semiconductor light-emitting element 14 to electrical contacts 20 formed on the circuit layout carrier 11. The difference between the thermal expansion coefficient of the semiconductor light-emitting element 14 and that of the composite substrate 10 is substantially smaller than or equal to $10 \times 10^{-6}/°$ C., thus the thermal stress between the semiconductor light-emitting element 14 and the composite substrate 10 is reduced. The composite substrate 10 serves not only as the supporting base of the semiconductor light-emitting element assembly 1 but also as a heat-dissipation media for the semiconductor light-emitting element 14.

The semiconductor light-emitting element 14 is, for example, an LED or an LD. The semiconductor light-emitting element 14 of the present invention basically is a die, and preferably is an unpackaged die, so that the heat generated from the die can be transmitted to the composite substrate 10 at a shorter distance. The thermal expansion coefficient of the die as the semiconductor light-emitting element 14 generally is between $1 \times 10^{-6}/°$ C. and $10 \times 10^{-6}/°$ C. For example, the thermal expansion coefficient of GaN is $5.4 \times 10^{-6}/°$ C.; that of InP is $4.6 \times 10^{-6}/°$ C.; that of GaP is $5.3 \times 10^{-6}/°$ C. In order to match with the thermal expansion coefficient of the semiconductor light-emitting element 14 for preventing excessive thermal stress formed between the semiconductor light-emitting element 14 and its contact material, the present invention uses the composite substrate 10 as the supporting base for the semiconductor light-emitting element assembly 1. Besides supporting the circuit layout carrier 11 and the semiconductor light-emitting element 14, the composite substrate 10 is also used as a heat-dissipation media. The composite material forming the composite substrate 10 is properly selected for making the difference between the thermal expansion coefficient of the semiconductor light-emitting element 14 and the thermal expansion coefficient of the composite substrate 10 smaller than or equal to $10 \times 10^{-6}/°$ C., thereby lessening the influence of the thermal stress between the semiconductor light-emitting element and the composite substrate.

The composite material is generally formed from two or more materials, and these two or more materials do not form any other molecular or atomic structures. Generally speaking, the composite material can combine the advantages of the respective materials so as to have better physical properties than the original materials thereof. The composite material usually has the advantages of lightweight, high strength, excellent thermal properties etc. The composite material is selected from a metal matrix composite (MMC), a polymer matrix composite (PMC), and ceramic matrix composite (CMC). These composites are respectively formed by mixing carbon fibers or ceramic fibers with metals, polymers, and ceramics. In order to transfer the heat generated by the semiconductor light-emitting element 14, it is preferable to use the metal matrix composite with a heat thermal conductivity coefficient not smaller than 150 W/mK and a thermal expansion coefficient not greater than $10 \times 10^{-6}/°$ C., such as aluminum matrix composite (its heat thermal conductivity coefficient is about 100~640 W/mK; and its thermal expansion coefficient of the composite substrate is about 5~$10 \times 10^{-6}/°$ C.) for forming the composite substrate 10. Nonetheless, a polymer matrix composite and ceramic matrix composite also can be used with to meet the actual needs.

The circuit layout carrier 11 is, for example, a printed circuit board, a flexible printed circuit, an Si substrate or a ceramic substrate, etc. The semiconductor substrate can use various semiconductor processes such as etching, sputtering etc. to form the desired circuits thereon, and also can be integrated with the process for forming the semiconductor light-emitting element. The heat thermal conductivity coefficient and the thermal expansion coefficient of the Si substrate are about 150 W/mK and $4 \times 10^{-6}/°$ C. respectively, which is close to those of the composite substrate 10, particularly the metal matrix composite substrate. Due to the closeness of the thermal properties of the Si substrate and the composite substrate 10, the thermal stress between the Si substrate and the composite substrate 10 can be effectively reduced and the heat conductive efficiency can be improved. Nonetheless, the printed circuit board or the flexible printed circuit also can be used to meet the actual needs.

The circuit layout carrier 11 is bonded with the composite substrate 10 via the connecting structure 12. The connecting structure 12 is made of adhesive material, preferably a flexible adhesive layer, and more preferably, the flexible adhesive layer preserving adhesion at a room temperature or a medium low temperature. The material forming the flexible adhesive layer can be such as benzocyclobutene (BCB), epoxy, polyimide, SOG (Spin On Glass), silicone, solder, equivalents thereof or combinations thereof. Those flexible adhesive materials can be cured at a relatively low temperature (commonly smaller than 300° C.), thereby reducing the thermal stress due to high temperature between the composite substrate 10 and the semiconductor light-emitting element 14; and/or between the composite substrate 10 and the circuit layout carrier 11, also lessening the damage to the semiconductor light-emitting element 14 due to high temperature.

Except the aforementioned flexible adhesive layer, a metal layer can be formed on the composite substrate 10, or on the composite substrate 10 and the semiconductor light-emitting element 14. A metal solder layer, such as AuSn, is formed between the metal layer and the semiconductor light-emitting element 14 or between two metal layers formed on the composite substrate 10 and the semiconductor light-emitting element 14, so that eutectic reaction occurs between the metal solder layer and the metal layers to bond the semiconductor light-emitting element 14 to the composite substrate 10.

Further, for transmitting the heat generated from the die to the composite substrate 10 at a shorter distance, the recess 13, such as a through hole, a blind hole, etc., can be formed on the circuit layout carrier 11 for accommodating the semiconductor light-emitting element 14. The recess 13 is preferably formed on the circuit layout carrier 11 and extends in a direction towards the composite substrate 10. For easy processing, the recess 13 is preferably formed before the circuit layout carrier 11 being bonded with the composite substrate 10. When the circuit layout carrier 11 is a printed circuit board, a mechanical processing method, such as drilling, bunching, etc., can be used to form the recess 13 thereon; when the circuit layout carrier 11 is a semiconductor substrate, a conventional semiconductor processes, such as chemical etching, plasma etching, etc., can be used to form the recess 13 thereon.

The composite substrate 10 is electrically conductive. If the positive and negative electrodes of the semiconductor light-emitting element 14 are on the same side and the epitaxial structure of the semiconductor light-emitting element 14 is an electrical conductor, as shown in FIG. 1A, to insulate the semiconductor light-emitting element 14 from the composite substrate 10 can further prevent current leakage from occurring, and/or may enhance ESD function. Otherwise, if the connecting structure 12 is an insulator, the recess 13 may extend up to the connecting structure 12 for preventing the semiconductor light-emitting element 14 from directly contacting the composite substrate 10. Alternatively, as shown in FIG. 1B, the semiconductor light-emitting element 14 is separated from the composite substrate 10 via an insulation material 21. The recess 13 therefore extends up to the composite substrate 10 so as to shorten the heat-conductive path between the semiconductor light-emitting element 14 and the composite substrate 10. However, in accordance with the process needs, the insulation material 21 also can be used to separate the semiconductor light-emitting element 14 from the composite substrate 10 as shown in FIG. 1A. On the contrary, the epitaxial structure of the semiconductor light-emitting element 14 is an electrical insulator or is insulated from the active layer, the semiconductor light-emitting element 14 can be in direct contact with the composite substrate 10, or fixed on the composite substrate 10 by another material, such as silver glue, insulation clue, solder, etc.

Second Embodiment

Figure 2:
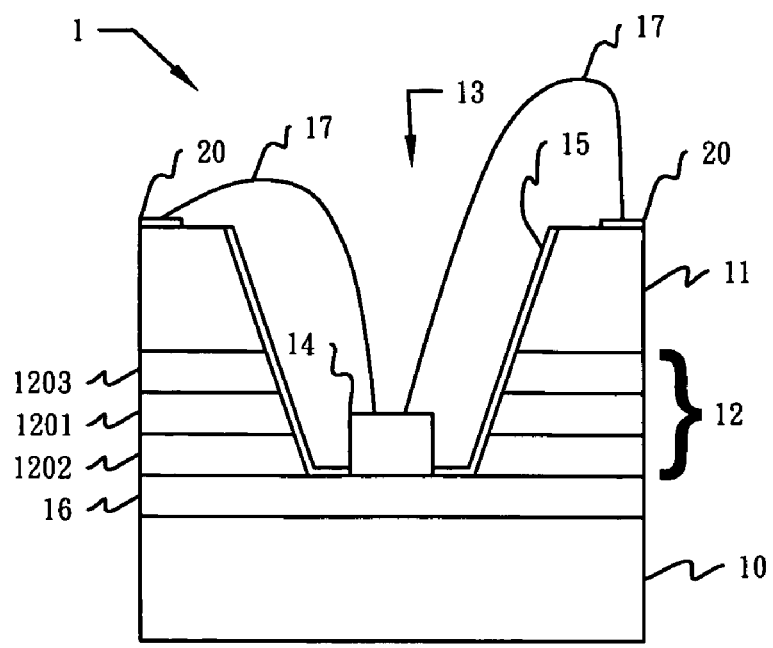
FIG. 2 is a schematic diagram showing the structure of a semiconductor light-emitting element assembly in accordance with a second embodiment of the present invention.

FIG. 2 is a schematic diagram showing the structure of a semiconductor light-emitting assembly 1 in accordance with a second embodiment of the present invention, wherein reference number 1201 denotes a flexible adhesive layer; 1202 and 1023 denote reaction layers; 15 denotes a reflection layer; and 16 denotes a planarizing layer.

As described in the first embodiment, the semiconductor light-emitting element 14 of the present invention is bonded with the circuit layout carrier 11 via the connecting structure 12. As shown in FIG. 2, the connecting structure 12 is composed of a flexible adhesive layer 1201, and a reaction layer 1202 and/or a reaction layer 1203 for enhancing the adhesion of connecting structure 12. The flexible adhesive layer 1201 can be formed with the material described in the first embodiment. The reaction layer 1202 is formed between the flexible adhesive layer 1201 and the circuit layout carrier 11; and/or the reaction layer 1203 is formed between the flexible adhesive layer 1201 and the composite substrate 10, for enhancing the adhesion between the flexible adhesive layer 1201 and the circuit layout carrier 11 and/or the composite substrate 10. The material forming the reaction layers 1202 and 1203 is such as silicon nitride ($SiN_x$), epoxy, titanium (Ti), chromium (Cr), or combinations thereof. The reaction layer 1202 and/or the reaction layer 1203 can be formed on the circuit layout carrier 11 and/or the composite substrate 10 by the method of physical vapor deposition (PVD) or chemical vapor deposition (CVD) in advance. Then, the flexible adhesive layer 1201 is formed on one side of the circuit layout carrier 11 and/or one side of the composite substrate 10. Thereafter, the circuit layout carrier 11 is bonded with the composite substrate 10 by applying proper pressing force and/or temperature for fixing the circuit layout carrier 11 to the composite substrate 10.

Moreover, when the surface of the composite substrate 10 is a rough surface, a planarizing layer 16 is formed on the surface of the composite substrate 10 for smoothening the rough surface of the composite substrate 10 and hence making the connecting structure 12 adhere to the composite substrate 10. The material forming the planarizing layer 16 is such as nickel (Ni) or any other materials adhesible to the connecting structure 12. Further, if the positive and negative electrodes of the semiconductor light-emitting element 14 are on the same side, and the epitaxial structure of the semiconductor light-emitting element 14 is an electrical conductor, the recess 13 can extend to the planarizing layer 16, the connecting structure 12 or the composite substrate 10, so that the semiconductor light-emitting element 14 is placed directly on the planarizing layer 16, the connecting structure 12 or the composite substrate 10.

To increase the light-emitting efficiency of the semiconductor light-emitting element 14, a reflection layer 15 is further formed inside the recess 13 for reflecting and guiding the light emitted by the semiconductor light-emitting element 14 mostly towards the same direction. The reflection material 15 is formed by a light-reflection material, such as gold, silver, aluminum, tin etc. The reaction layer 15 is formed on the partial or whole interior surface of the recess 13 by using various film deposition methods. Further, when the reflection layer 15 is electrical conductive, for keeping the insulation between the semiconductor light-emitting element 14 and the reflection layer 15, the reflection layer 15 is preferably not formed on the area above the semiconductor light-emitting element 14 covering the composite substrate 10. In addition, for enabling the reflection layer 15 to achieve better reflection efficiency, the recess 13 is formed in a tapered shape, i.e. the inner wall of the recess 13 has a slope that forms a funnel-shape space.

Third Embodiment

FIGS. 3A to 3H are schematic diagrams showing the structure of a semiconductor light-emitting element assembly 1 in accordance with a third embodiment of the present invention, wherein reference number 18 denotes a light pervious member; 18a denotes filling material; and 19 denotes wavelength-converting material. Such as disclosed in the aforementioned embodiments, the positive and negative electrodes of the semiconductor light-emitting element 14 are on the same side, and the conductive wires 17 are used to connect the positive and negative electrodes to the electrical contacts 20. However, the semiconductor light-emitting element 14 of the present invention is alternatively a flip-chip structure, i.e. both of the positive and negative electrodes on the same side face towards the composite substrate 10. If the semiconductor light-emitting element 14 is in the flip-chip format, the conductive wires 17 are not needed. Otherwise the electrical contact 20a has to extend to inside of the recess 13 so as to respectively connect with the positive and negative electrodes of the semiconductor light-emitting element 14, as shown in FIG. 3A to FIG. 3D.

For protecting the semiconductor light-emitting element 14 and other components installed in the recess 13, a light pervious member 18 covers the area above the semiconductor light-emitting element 14. In addition to the purpose of protecting the semiconductor light-emitting element 14, the conductive wires 17 and the reflection layer 15, the light pervious member 18 can be properly designed to increase the light-emitting efficiency of the semiconductor light-emitting element 14, or to provide a light pattern different from the original one generated by the semiconductor light-emitting element 14. The light pervious member 18 is preferably an optical lens, such as a convex lens, a concave lens, a scattering lens, etc.

The material forming the light pervious member 18 is such as epoxy, acrylic resin, cyclo-olefin co-polymer (COC), poly-methyl-methacrylate (PMMA), polycarbonate (PC), poly-etherimide, fluorocarbon polymer, silicone, the combinations thereof, or other material that enables to stop the transmission of light.

Besides, filling material 18a is filled between the light pervious member 18 and the semiconductor light-emitting element 14 for releasing the stress concentration caused by the light pervious member 18 on the semiconductor light-emitting element 14. The filling material 18a is such as silicone, etc.

The light generated by the semiconductor light-emitting element 14 through the wavelength-converting material 19 is converted into light with wavelength different from the original one. The wavelength-converting material 19 is such as a fluorescent powder, a color filter, equivalents thereof or combinations thereof.

Figure 3A:
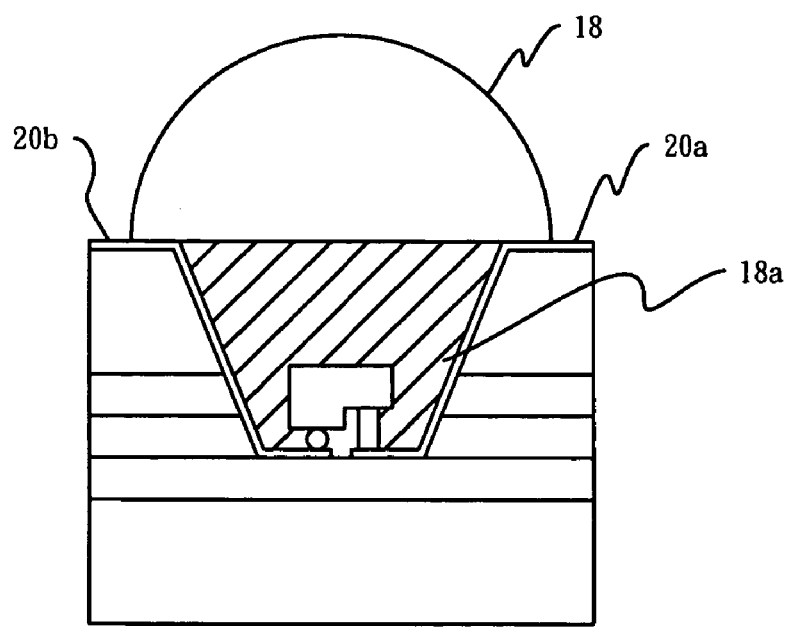
FIGS. 3A to 3H are schematic diagrams showing the structure of a semiconductor light-emitting element assembly in accordance with a third embodiment of the present invention.
Figure 3B:
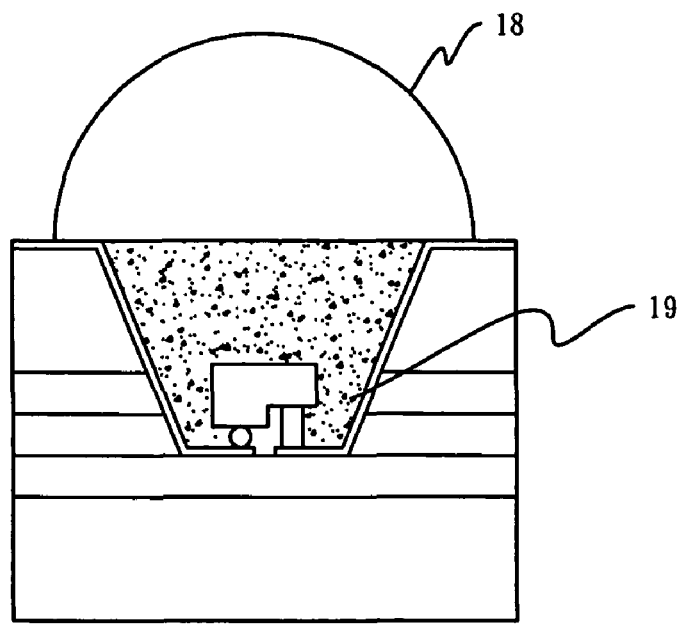

While being applied, the wavelength-converting material 19 is disposed to cover the area above the semiconductor light-emitting element 14, and then the light pervious member 18 is capped to restrict and protect the wavelength-converting material 19, as shown in FIG. 3B.

Figure 3C:
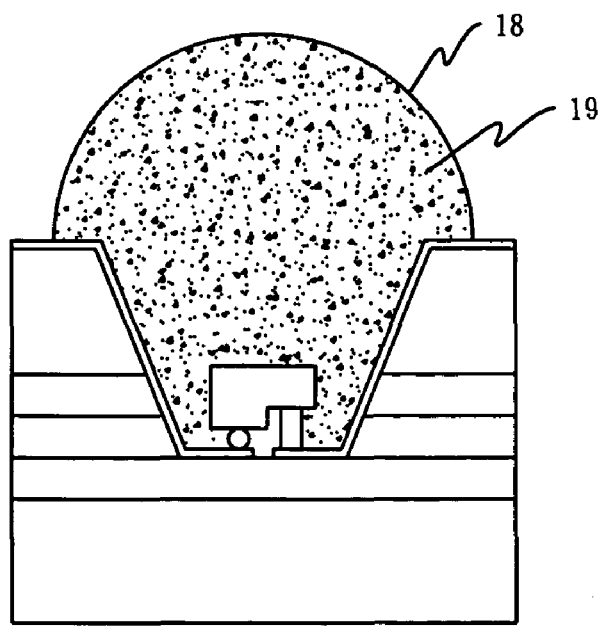

Alternatively, the wavelength-converting material 19 and the light pervious member 18 are mixed with a adhesive material, such as epoxy, and then are capped the area above the semiconductor light-emitting element 14, such as FIG. 3C. Preferably, without the mixing into the light pervious member 18 or with an adhesive material, the wavelength-converting material 19 is spread the area above the semiconductor light-emitting element 14 by sedimentation. When the wavelength-converting material 19 is congregated by sedimentation, the light pervious member 18 can be installed above the wavelength-converting material 19 to protect the wavelength-converting material 19, as shown in FIG. 3B.

Figure 3D:
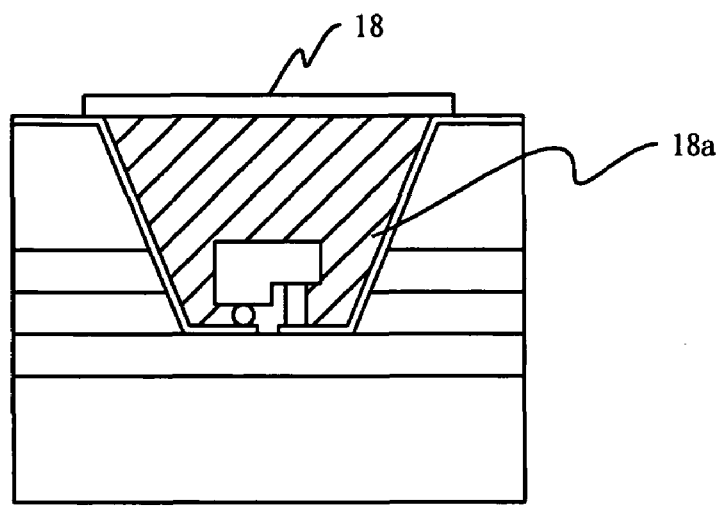

If the wavelength-converting material 19 is a color filter, the wavelength conversion can be achieved by installing the color filter on a light-radiating path of the semiconductor light-emitting element 14, as shown in FIG. 3D. Alternatively, the filling material 18a is filled under the color filter for protecting the semiconductor light-emitting element 14 and forming a gradient of refractive index favorable to light transmission.

Figure 3E:
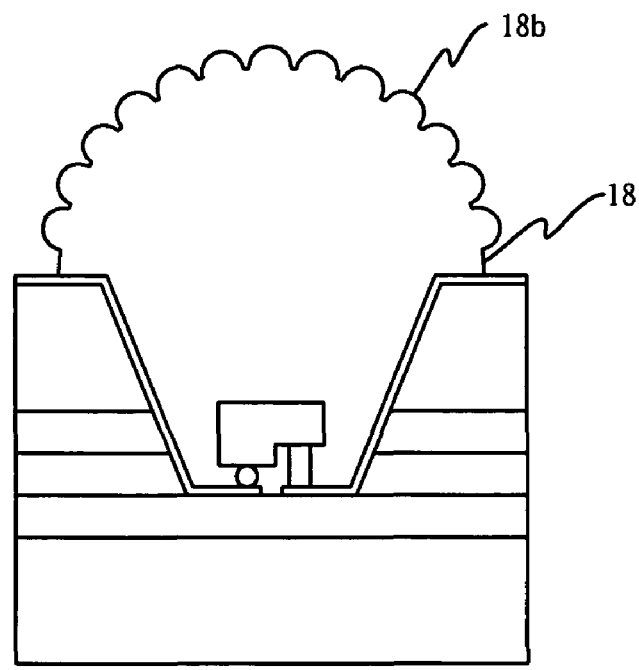
Figure 3F:
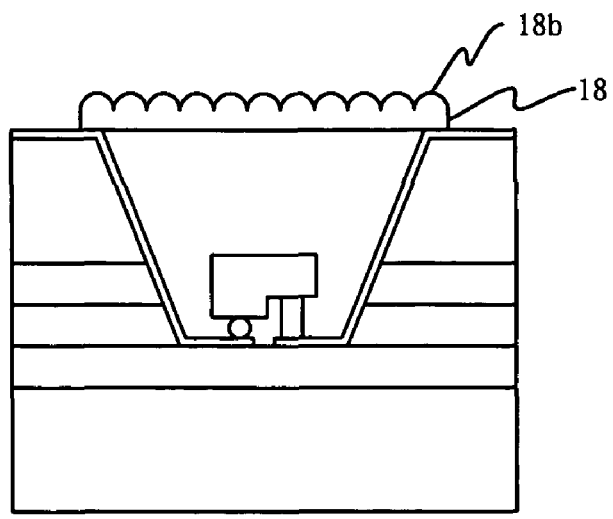
Figure 3G:
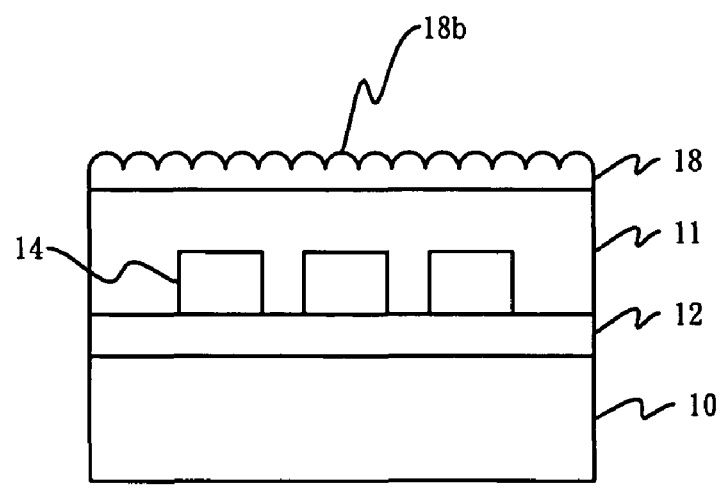

Such as shown in FIGS. 3E to 3G, a wavelike array 18b is further formed on the light pervious member 18, wherein the wavelike array 18b has a wavelike surface having a fixed wave propagation direction, i.e. the array direction or wavefront direction of the wavelike array 18b. The wave structures formed on the wavelike array 18b are a plurality of micro-lenses through which light is refracted at various angles and is blurred from generating local light spots. For enabling the wavelike array 18b to achieve a better light-scattering performance, the diameter of each micro-lens is about 50-60 μm. If the waves of the wavelike array 18b constructed consecutively, a distance between two consecutive wave peaks or troughs is about between 100 μm and 120 μm.

If the arrangement direction of a plurality of semiconductor light-emitting elements 14 is parallel to the array direction of the wavelike array 18b, i.e. the wavefront direction, the light passing through the wavelike array 18b will be transferred into a light pattern that is substantially parallel to the wavefront direction of the wavelike array 18b. Hence, when the arrangement direction of the semiconductor light-emitting elements 14 and the wavefront direction of the wavelike array 18b both are arranged in a linear pattern, the light will be distributed as a linear pattern; when the arrangement direction of the semiconductor light-emitting elements 14 and the wavefront direction of the wavelike array 18b both are arranged in a curved pattern or in a radiating pattern, the light will be distributed as a curved pattern or a radiating pattern. Theoretically, the arrangement direction of the semiconductor light-emitting elements 14 is parallel or about parallel to the wavefront direction of the wavelike array 18b, the light generated from the semiconductor light-emitting elements 14 can be distributed as a light pattern extending along the wavefront direction.

Figure 3H:
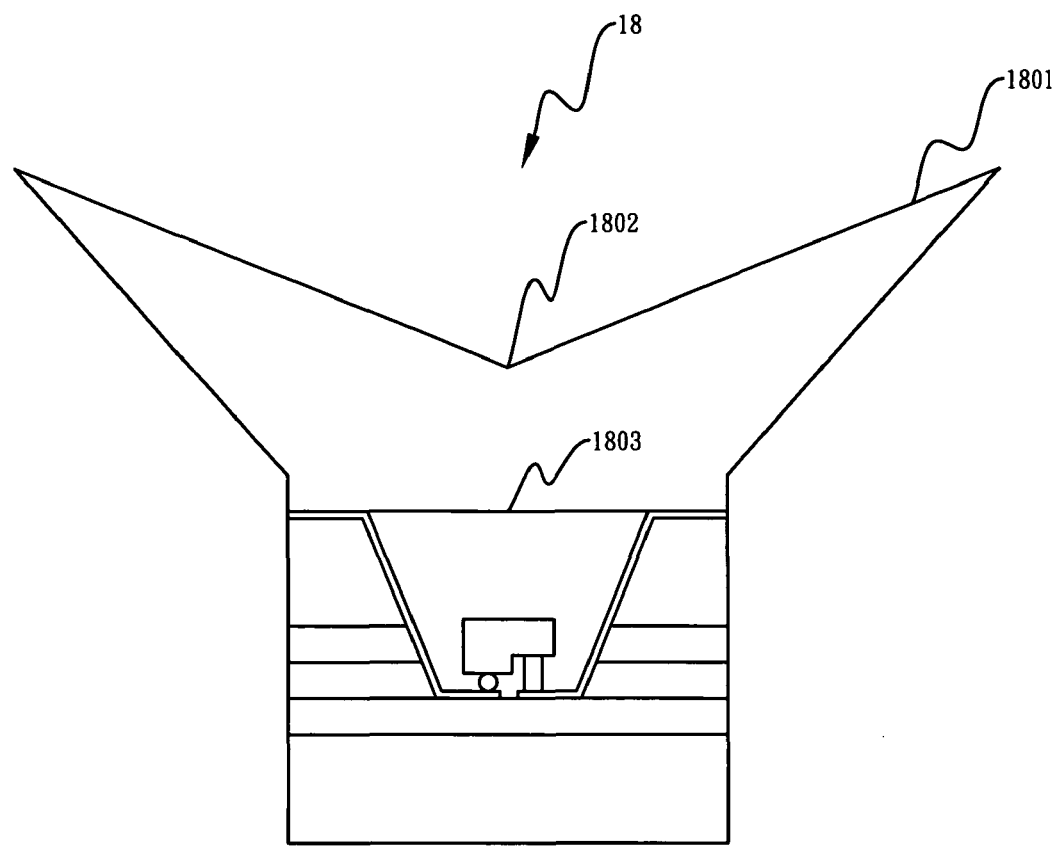

As shown in FIG. 3H, the light pervious member 18 can be formed in a wing-shaped protrusive shape, and has a wing-shaped protrusion part 1801, a recessed opening 1802 and a light-entering surface 1803. The recessed opening 1802 is located at a position far away from the light-entering surface 1803, and preferably, at the side opposite to the light-entering surface 1803. The wing-shaped protrusion part 1801 extends from the recessed opening 1802 and towards two opposite sides of the recessed opening 1802, wherein the tips of the wings are not limited to be formed in an acute shape, but also can be formed in an curved shape or flat surface. The light pervious member 18 extends in a longitudinal direction, and preferably, extends in a direction perpendicular to the direction in which the wing-shaped protrusion part 1801 extends.

A portion of the light that is emitted from the semiconductor light-emitting elements 14 and incidents the light-entering surface 1803 is total-internal-reflected by the recessed opening 1802 to both sides thereof and be directed to the wing-shaped protrusion part 1801, and other portions of the light that passes through the recessed opening 1802 may be refracted with the Snell's law applied to the difference of the refractive indexes between the light pervious member 18 and the ambient optical medium. Since a portion of the light is total-internal-reflected, the flux of the light directly leaving out the recessed opening 1802 is reduced, thus preventing the light emitted from the semiconductor light-emitting elements 14 from forming local light spots on the light pervious member 18. The shape of the recessed opening 1802 can be a V shape or U shape, and preferably, the apex thereof points to the light-entering surface 1803, or to the light-exiting direction of the semiconductor light-emitting elements 14.

The light directly or indirectly entering to the wing-shaped protrusion part 1801 leaves out the wing-shaped protrusion part 1801 by the reflection or the refraction; or is gradually mixed together after several times of internal reflection within the wing-shaped protrusion part 1801.

Further, the wavelike array 18b also can be formed on the wing-shaped protrusion part 1801, in the recessed opening 1802 and/or on the light-entering surface 1803. If the arrangement direction of the semiconductor light-emitting elements 14 is parallel or about parallel to the wavefront direction of the wavelike array 18b; or to the longitudinal direction of the light pervious member 18, the light will be spread in accordance with the wavefront direction and longitudinal direction, such as described above.

The semiconductor light-emitting elements 14 are such as the LEDs that emit visible or invisible light. When the semiconductor light-emitting elements 14 emit invisible light, the wavelength-converting material 19 can be the material that can be excited by the invisible light and generate visible light.

If the wavelength of the light emitted from the semiconductor light-emitting elements 14 covers UV (Ultraviolet) light, i.e. 10-420 nm, preferably 200-420 nm, a color light, such as red, blue and/or green light, then can be emitted by a selected wavelength-converting material 19 that can be excited by UV light. The wavelength-converting material 19 that can be excited by UV light and emits red light is such as $Y_2O_2S:Eu,Bi$; $Y_2O_3S:Eu,Bi$; and $3.5MgO.0.5MgF_2.GeO_2:Mn^{+4}$, wherein the excited wavelength thereof is 330 nm-420 nm; the wavelength-converting material 19 that can be excited by UV light and emits blue light is such as $BaMg_2Al_{16}O_{27}:Eu$; $(SaBaCa)_5(PO_4)_3Cl:Eu$; and $Sr_4Al_{14}O_{25}:Eu$, wherein the excited wavelength thereof is 220 nm-330 nm. The wavelength-converting material 19 that can be excited by UV light and emits green light is such as an alkaline earth silicate phosphor, preferably, is an europium (Eu)-alkaline earth silicate phosphor, wherein the excited wavelength thereof is 200 nm-420 nm, and preferably is 360 nm-400 nm, and the composition thereof is such as $(SrBaMg)_2SiO_4:Eu$, which has a narrow wave width, for example, the FWHM (Full Width Half Maximum) thereof is smaller than 35 nm and the FWHM of green light emitted by InGaN LEDs. The commercial products are available from the phosphors fabricated by Internatix Corporation, CA., USA, such as G400™/G380™/G360™ series.

Other phosphors that can be excited by UV light and emits green light is such as $(Ba_{1-x-y-z}Ca_xSr_yEu_z)_2(Mg_{1-w}Zn_w)Si_2O_7$, wherein $x+y+z=1$, $0.05>z>0$ and $w<0.05$; $Ca_8Mg(SiO_4)_4Cl_2$: Eu,Mn; $Ba_2SiO_4:Eu$; $Ba_2MgSi_2O_7:Eu$; $Ba_2Al_2O_4:Eu$; $SrAl_2O_4:Eu$; and $BaMg_2Al_{16}O_{27}:Eu$, etc., wherein the excited wavelength thereof is 330 nm-420 nm.

The wavelength-converting material 19 can be formed above the semiconductor light-emitting elements 14 during process to package the semiconductor light-emitting elements 14 to form a semiconductor light-emitting element assembly 1, or can be directly formed on a chip during the chip manufacturing process and avoid disposing the wavelength-converting material in the light pervious member 18 or between the light pervious member 18 and the semiconductor light-emitting elements 14. The method for forming the wavelength-converting material 19 directly on a chip can be applied to formation of the wavelength-converting material 19 as described in the present embodiment.

Although the present embodiment uses the flip-chip-typed semiconductor light-emitting elements 14 as an example for explanation, yet the present invention is not limited thereto, the semiconductor light-emitting element 14 shown in the second embodiment also can be used herein.

Fourth Embodiment

Figure 4A:
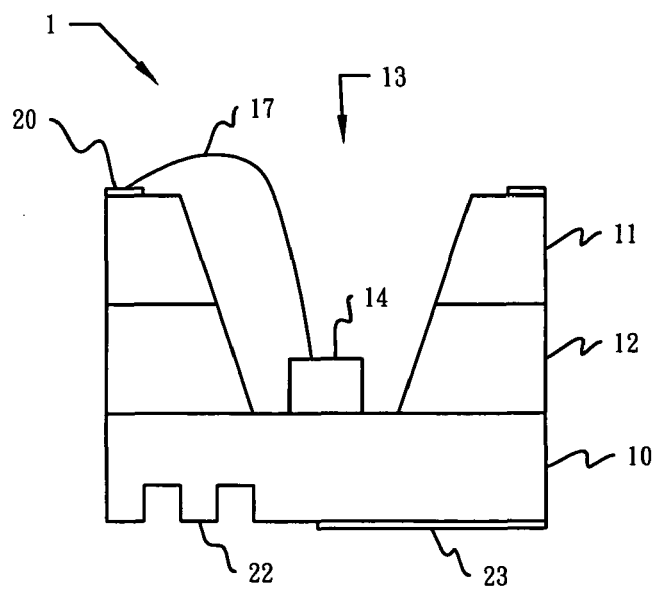
FIGS. 4A and 4B are schematic diagrams showing the structure of a semiconductor light-emitting element assembly in accordance with a fourth embodiment of the present invention.
Figure 4B:
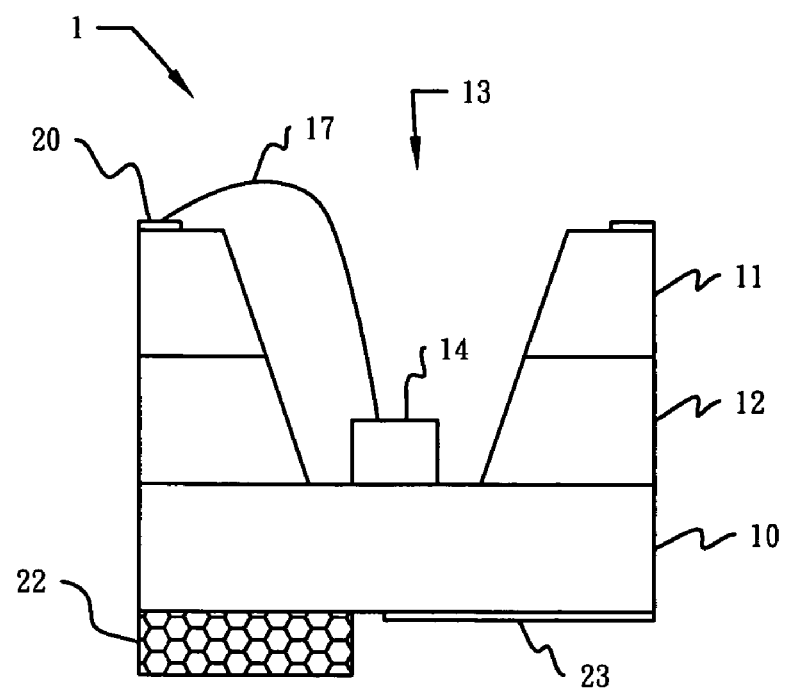

FIG. 4A and FIG. 4B are schematic diagrams showing the structure of a semiconductor light-emitting element assembly 1 in accordance with a fourth embodiment of the present invention, wherein reference number 22 denotes a convective heat transfer device; and 23 denotes a bottom electrical contact.

When the positive and negative electrodes of the semiconductor light-emitting element 14 are on opposite sides, i.e. one electrode is on the area away from the composite substrate 10, while the other electrode is on the area facing the composite substrate 10 and is not easy to connect to the electrical contact 20 via the conductive wire 17. Meanwhile, if the composite substrate 10 is an electrical conductor, one of the electrodes of the semiconductor light-emitting element 14 can be in direct contact with the composite substrate 10, such as shown in FIG. 4A and FIG. 4B, the composite substrate 10 is functioned as an electrical contact; or a bottom electrical contact 23 is disposed on the composite substrate 10 as a contact for output connection. Alternatively, a conductive through hole (not shown) can be formed in the composite substrate 10 for electrically connecting the semiconductor light-emitting element 14 to the bottom electrical contact 23.

Further, for enhancing the heat-dissipation performance, a convective heat transfer device 22 is installed on the composite substrate 10. The convective heat transfer device 22 is such as heat dissipation fins, porous ceramic material, porous composite material, etc., which removes the heat transmitted from the semiconductor light-emitting element 14 to the composite substrate 10 by natural or forced convection with ambient fluid. Due to high thermal conductivity coefficient, the composite substrate 10 thus has uniform temperature distribution, so that the bulk temperature of the composite substrate 10 can be effectively decreased with the assistance of the convective heat transfer device 22. The convective heat transfer device 22 can be directly formed as a unity with the composite substrate 10 as shown in FIG. 4A; or can attached to the composite substrate 10 as an independent element as shown in FIG. 4B.

The recess 13 is exemplarily shown in the aforementioned embodiments and is not a requisite for the present invention. In other words, the semiconductor light-emitting element 14 can be disposed on the circuit layout carrier 11 on which the recess 13 is not formed, and the light pervious member 18 and/or the wavelength-converting material 19 can be disposed to cover the semiconductor light-emitting element 14, wherein the forming sequence of the light pervious member 18 and/or the wavelength-converting material 19 is as shown in FIG. 3A to FIG. 3D, and the other dispositions are also the same as what are described in the aforementioned embodiments.

Figure 5:
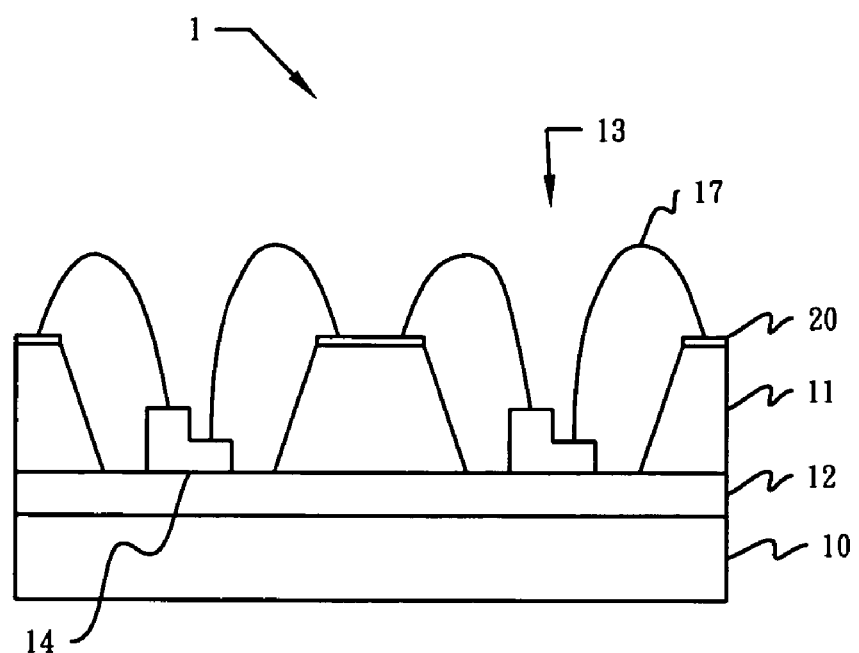
FIG. 5 is a schematic diagram showing the structure of a semiconductor light-emitting element assembly in accordance with another preferred embodiment of the present invention.

Moreover, the semiconductor light-emitting element assembly 1 of the present invention also can be in an array format, as shown in FIG. 5. A plurality of recesses 13 are formed on the circuit layout carrier 11, and one or more semiconductor light-emitting elements 14 are disposed in the each of recesses 13 and electrically connected in parallel or in series. Alternatively, the plurality of semiconductor light-emitting elements 14 also can be disposed on the composite substrate 10 without the recesses 13. The structural variations of the semiconductor light-emitting array are similar to those described in the aforementioned embodiments, and are not explained again herein.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A semiconductor light-emitting element assembly comprising:
    a composite substrate with a thermal expansion coefficient substantially smaller than or equal to $12 \times 10^{-6}/°$ C., and a thermal conductivity coefficient substantially greater than or equal to 150 W/mK;
    a circuit layout carrier;
    a connecting structure for bonding the composite substrate with the circuit layout carrier;
    a semiconductor light-emitting element disposed on one side of the composite substrate and electrically connected to the circuit layout carrier; and
    a recess formed on the circuit layout carrier and extending toward the composite substrate, wherein the semiconductor light-emitting element is deposited in the recess.

2. The semiconductor light-emitting element assembly of claim 1, wherein the composite material is selected from a group consisting of a metal matrix composite (MMC), a polymer matrix composite (PMC), ceramic matrix composite (CMC), and combinations thereof.

3. The semiconductor light-emitting element assembly of claim 1, wherein the difference between a thermal expansion coefficient of the semiconductor light-emitting element and the thermal expansion coefficient of the composite substrate is substantially smaller than or equal to $10 \times 10^{-6}/°$ C.

4. The semiconductor light-emitting element assembly of claim 1, wherein the circuit layout carrier is selected from a group consisting of a semiconductor substrate, a printed circuit board (PCB), a flexible printed circuit (FPC), a Si substrate, a ceramic substrate and an equivalent or combination thereof.

5. The semiconductor light-emitting element assembly of claim 1, wherein the composite substrate comprises a composite material that includes a fiber that is one of a carbon fiber and a ceramic fiber, and the composite material is formed by mixing the fiber with one of metals, polymers and ceramics.

6. The semiconductor light-emitting element assembly of claim 1, wherein the connecting structure comprises a flexible adhesive layer.

7. The semiconductor light-emitting element assembly of claim 6, wherein the flexible adhesive layer comprises a material selected from a group consisting of benzocyclobutene (BCB), epoxy, polyimide, SOG (Spin On Glass), silicone, solder, and an equivalent or combination thereof.

8. The semiconductor light-emitting element assembly of claim 6, wherein the connecting structure further comprises:
    a reaction layer formed on one side of the flexible adhesive layer.

9. The semiconductor light-emitting element assembly of claim 8, wherein the reaction layer comprises a material selected from the group consisting of silicon nitride ($SiN_x$), epoxy, titanium (Ti), chromium (Cr), and an equivalent or combinations thereof.

10. The semiconductor light-emitting element assembly of claim 1, wherein the connecting structure comprises a plurality of metal layers connecting the semiconductor light-emitting element and the composite substrate by eutectic bonding.

11. The semiconductor light-emitting element assembly of claim 1, wherein the recess is formed in a tapered shape.

12. The semiconductor light-emitting element assembly of claim 1, wherein the recess contains a reflection layer.

13. The semiconductor light-emitting element assembly of claim 1, further comprising:
    a light pervious member covering the recess.

14. The semiconductor light-emitting element assembly of claim 13, further comprising:
    a wavelike array formed on the light pervious member and having a wavefront direction.

15. The semiconductor light-emitting element assembly of claim 14, wherein the semiconductor light-emitting element is substantially arranged in accordance with the wavefront direction.

16. The semiconductor light-emitting element assembly of claim 13, wherein the light pervious member is an optical lens.

17. The semiconductor light-emitting element assembly of claim 13, wherein the light pervious member comprises:
    a light-entering surface facing to the semiconductor light-emitting element;
    a recessed opening; and
    a wing-shaped protrusion part extending from the recessed opening and towards two opposite sides of the recessed opening.

18. The semiconductor light-emitting element assembly of claim 17, wherein the recessed opening has an apex pointing to the light-entering surface.

19. The semiconductor light-emitting element assembly of claim 1, further comprising:
    a wavelength-converting material disposed above the semiconductor light-emitting element for converting a wavelength of light.

20. The semiconductor light-emitting element assembly of claim 19, wherein the wavelength-converting material is selected from a group consisting of a fluorescent powder, a color filter, and an equivalent or combination thereof.

21. A semiconductor light-emitting element assembly, comprising:
    a composite substrate with a thermal expansion coefficient substantially smaller than or equal to $12 \times 10^{-6}/°$ C., and a thermal conductivity coefficient substantially greater than or equal to 150 W/mK;
    a circuit layout carrier;
    a connecting structure for bonding the composite substrate with the circuit layout carrier;

a semiconductor light-emitting element disposed on one side of the composite substrate and electrically connected to the circuit layout carrier; and a planarizing layer formed between the composite substrate and the connecting structure.

22. The semiconductor light-emitting element assembly of claim 21, wherein the planarizing layer comprises nickel (Ni) or a material adherable to the connecting structure.

23. The semiconductor light-emitting element assembly of claim 1, wherein the semiconductor light-emitting element is selected from a group consisting of a light-emitting diode (LED), a laser diode (LD), and an equivalent or combination thereof.

24. The semiconductor light-emitting element assembly of claim 1, wherein the semiconductor light-emitting element is in a flip-chip structure.

25. The semiconductor light-emitting element assembly of claim 24, further comprising an electrical contact forming on at least one portion of the surface of the recess and electrically connected to the semiconductor light-emitting element and the circuit layout carrier.

26. The semiconductor light-emitting element assembly of claim 1, further comprising:

a convective heat transfer device connected to the composite substrate for cooling the composite substrate by heat convection.

27. The semiconductor light-emitting element assembly of claim 26, wherein the convective heat transfer device is selected from a group consisting of heat dissipation fins, porous ceramic material, porous composite material, and an equivalent or combination thereof.

28. The semiconductor light-emitting element assembly of claim 1, wherein the semiconductor light-emitting element is electrically connected to the composite substrate.

29. The semiconductor light-emitting element assembly of claim 28, wherein the semiconductor light-emitting element is electrically connected to a bottom electrical contact disposed on the other side the composite substrate.

30. The semiconductor light-emitting element assembly of claim 28, wherein the composite substrate is formed with a conductive through hole for electrically connecting to the semiconductor light-emitting element.

31. The semiconductor light-emitting element assembly of claim 1, wherein the semiconductor light-emitting element comprises:

an ultraviolet (UV) light emitter;

a wavelength-converting material being irradiated by the UV light emitter and emitting visible light.

32. The semiconductor light-emitting element assembly of claim 31, wherein the wavelength-converting material comprises europium(Eu)-activating alkaline earth silicate.

* * * * *